United States Patent
Takahashi (10) Patent No.: US 7,810,016 B2
(45) Date of Patent: Oct. 5, 2010

(54) SEMICONDUCTOR STORAGE DEVICE EQUIPPED WITH ECC FUNCTION

(75) Inventor: Hiroyuki Takahashi, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 1003 days.

(21) Appl. No.: 11/593,012

(22) Filed: Nov. 6, 2006

(65) Prior Publication Data

US 2007/0113155 A1    May 17, 2007

(30) Foreign Application Priority Data

Nov. 11, 2005    (JP)    ............................. 2005-327011

(51) Int. Cl.
*G11C 29/00*    (2006.01)
(52) U.S. Cl. .................................. 714/768; 365/185.09
(58) Field of Classification Search .................. 714/768; 365/185.09
See application file for complete search history.

(56) References Cited

U.S. PATENT DOCUMENTS

| | | | | |
|---|---|---|---|---|
| 6,043,946 A * | 3/2000 | Genheimer et al. | ........... | 360/53 |
| 6,044,483 A * | 3/2000 | Chen et al. | ................... | 714/762 |
| 6,549,460 B2 * | 4/2003 | Nozoe et al. | ........... | 365/185.09 |
| 6,697,310 B1 * | 2/2004 | Kuriuzawa et al. | ........ | 369/53.11 |
| 6,937,247 B2 * | 8/2005 | Chang et al. | ................. | 345/567 |
| 7,200,780 B2 * | 4/2007 | Kushida | ....................... | 714/52 |
| 7,404,137 B2 * | 7/2008 | Lin et al. | ..................... | 714/768 |
| 7,516,371 B2 * | 4/2009 | Sakaue et al. | ................. | 714/52 |
| 2001/0042230 A1 * | 11/2001 | Williams et al. | ............ | 714/703 |
| 2003/0182611 A1 * | 9/2003 | Wu | ............................. | 714/752 |

FOREIGN PATENT DOCUMENTS

| | | |
|---|---|---|
| JP | 62-214599 | 9/1987 |
| JP | 01-239656 | 9/1989 |
| JP | 01-273154 | 11/1989 |
| JP | 01-290200 | 11/1989 |
| JP | 11-102326 | 4/1999 |
| JP | 11-110997 | 4/1999 |
| JP | 2000-149592 | 5/2000 |
| JP | 2003-085996 | 3/2003 |

OTHER PUBLICATIONS

Japanese Patent Office issued a Japanese Office Action dated Sep. 28, 2009, Application No. 2005327011.

* cited by examiner

*Primary Examiner*—Esaw T Abraham
(74) *Attorney, Agent, or Firm*—Young & Thompson (57) ABSTRACT

A semiconductor memory device includes a memory cell array, an ECC (error correction code) circuit and a decision circuit. The ECC circuit calculates an error correction code for write data to be written in the memory cell array. The decision circuit invalidates the ECC circuit when a data width of the write data is less than a predetermined data width.

15 Claims, 6 Drawing Sheets

SEMICONDUCTOR STORAGE DEVICE EQUIPPED WITH ECC FUNCTION

BACKGROUND OF THE INVENTION

1. Field of the Invention

The present invention relates to a semiconductor storage device. More particularly, the present invention relates to a semiconductor storage device equipped with an ECC function.

2. Description of the Related Art

There is known an ECC (error correction code) circuit mounted on a semiconductor storage device such as a DRAM. The ECC circuit can not only detect a memory error merely but also specify a position (bit) of an error in data and correct it to a correct value. Specifically, the ECC circuit calculates information referred to as "error correction code (ECC)" to the data in writing the data. The calculated ECC is stored in a memory space. When the data is then read, the ECC circuit detects and corrects the error of the read data by referring to the ECC previously calculated.

The data width of write data required for calculating the ECC is previously determined. For example, when a data bus width is 64 bits, one ECC is calculated for the write data of 64 bits. The number of bits of the calculated ECC is determined by a predetermined algorithm. In this case, the number of bits is 8 bits. Therefore, when the data of 256 bits is written, the total number of the bits of the calculated four ECCs is 32 bits.

According to the algorithm, the number of bits of the calculated ECC tends to be slowly increased with the increase of the width of the write data. Japanese Laid-Open Patent Application JP-A-Heisei, 11-102326 discloses a technique for suppressing the increase of the ECC using this tendency. According to this technique, one ECC is calculated in a data unit to which burst-write is carried out. For example, when the data bus width is 64 bits and the burst length is 4, one ECC is calculated for data of 256 bits. In this case, the number of bits of the calculated ECC is 9 bits, and the memory space occupied by the ECC is reduced as a whole.

We have now discovered the following facts. The present inventor has focused attention on a following point. In the ECC circuit, the data width for calculating the ECC is previously determined, and the predetermined data width is, for example, 64 bits. However, for example, only the data of 1 byte may be written for convenience of a system (Byte Write). Hereinafter, the writing of the data of under such a predetermined data width is referred to as "part writing". Although the technique disclosed in the above-mentioned JP-A-Heisei, 11-102326 can reduce the ECC by putting the data together in calculating the ECC, the technique cannot deal with the part writing.

SUMMARY OF THE INVENTION

In order to achieve an aspect of the present invention, the present invention provides a semiconductor memory device including: a memory cell array; an ECC (error correction code) circuit configured to calculate an error correction code for write data to be written in the memory cell array; and a decision circuit configured to invalidate the ECC circuit when a data width of the write data is less than a predetermined data width.

In the present invention, the ECC circuit is invalidated when the data width of the write data is less than the predetermined data width. Therefore, even though the data, of which the data width is less than the predetermined data width, is included in data to be written in the memory cell array, the time for the data write processing can be reduced as a whole. That is, the speed of the data write processing can be increased as a whole.

The semiconductor storage device according to the present invention can handle the part writing. Also, an operation speed of the semiconductor storage device is increased as a whole.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments of a semiconductor storage device according to the present invention will be described below with reference to the attached drawings. The semiconductor storage device according to the present invention is equipped with the ECC circuit.

1. Configuration and Functions

Figure 1:
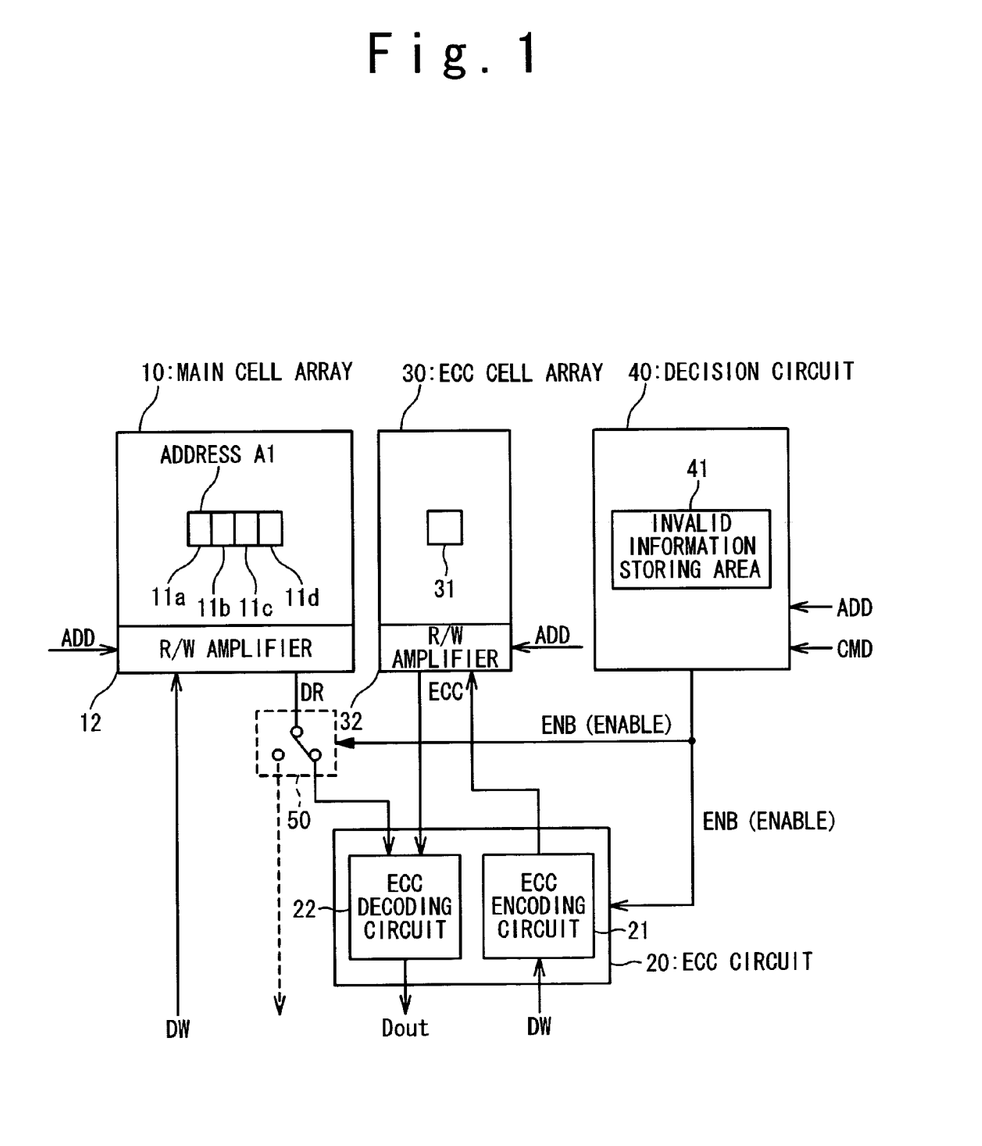
FIG. 1 is a block diagram showing a configuration of a semiconductor storage device when a validation signal ENB is generated in an embodiment of the present invention.

First, the configuration and the functions of the semiconductor storage device according to the embodiment of the present invention will be described referring to FIG. 1. In the following description, it is assumed that a data bus width is 32 bits.

A main cell array 10 is a storage area for storing data supplied from the outside of a memory, and has a plurality of memory cells arranged in a shape of an array. An R/W amplifier 12 writes write data DW in a write address specified by an address signal ADD, or reads read data DR from a read address specified by the address signal ADD. For example, the write data DW of 32 bits is written in blocks 11a to 11d specified by an address A1. It is assumed that the blocks 11a to 11d can store data of 1 byte (8 bits), respectively.

The ECC circuit 20 includes an ECC encoding circuit 21 and an ECC decoding circuit 22. The ECC encoding circuit 21 calculates one ECC (parity) for one write data DW. The data width required for calculating the ECC is previously determined. In this example, it is assumed that the predetermined data width is "32 bits". The ECC calculated by the ECC encoding circuit 21 is stored in an ECC cell array 30 to be described later so as to be associated with the write address. On the other hand, the ECC decoding circuit 22 receives the read data DR read from the read address and the ECC associated with the read address from the ECC cell array 30. The ECC decoding circuit 22 inspects whether or not a bit error is caused in the read data DR using the received ECC. When the error is detected, the ECC decoding circuit 22 corrects the bit error. The read data DR is outputted to the outside as output data Dout after the error detection/correction processing.

The ECC cell array 30 is a storage area for storing the ECC calculated by the ECC circuit 20. An R/W amplifier 32 writes the ECC in an area specified by the address signal ADD, or reads the ECC from the area. For example, when certain write data DW is written in the above blocks 11a to 11d, the ECC calculated for the write data DW is stored in a block 31 corresponding to the address A1. When the read data DR is read from the blocks 11a to 11d, the ECC is also read from the block 31.

As described above, the ECC circuit 20 is constituted so as to calculate one ECC from the write data DW of 32 bits. However, only the write data DW of less than 32 bits may be written for convenience of the system. As the example, there has been known "Byte Write" in which only the data of 1 byte (8 bits) is rewritten. For example, although large data such as image data is written in a unit of 32 bits, variables or the like used by an application software are rewritten by the byte write. When the data width of the write data DW, including the byte write, is less than 32 bits, hereinafter, the writing is referred to as the "part writing".

According to the present embodiment, the ECC function is stopped when the part writing is performed. That is, when the part writing is performed, the ECC circuit 20 is invalidated. Therefore, a decision circuit 40 is provided in the semiconductor storage device according to the present embodiment. The decision circuit 40 is a circuit for determining whether the ECC circuit 20 is validated or invalidated. The decision circuit 40 can determine whether the ECC circuit 20 is validated or invalidated based on a command signal CMD. Specifically, if the command signal CMD shows the "part writing", the ECC circuit 20 needs only to be invalidated. Also, when the part writing is performed, the decision circuit 40 generates "invalidation information". This invalidation information shows that the ECC circuit 20 is invalidated by the part writing, and shows that the ECC associated with the address to which the part writing is performed became invalid. In order to hold the invalidation information, the decision circuit 40 includes an invalidation information storing area 41.

2. Ordinary Writing/Reading

An ordinary writing operation and reading operation will be described referring to FIG. 1. In this case, the data width of the write data DW written in the main cell array 10 satisfies a predetermined number of bits (32 bits). Since the command signal CMD does not show the "part writing", the decision circuit 40 outputs an enable signal ENB for activating the ECC circuit 20 to the ECC circuit 20. It can be said that the enable signal ENB is a "validation signal" showing that the ECC circuit is valid. The ECC circuit 20 is normally operated in response to this enable signal ENB. That is, the ECC encoding circuit 21 calculates one ECC for the write data DW. While the write data DW is written in the blocks 11a to 11d specified by the address A1, the calculated ECC is written in the block 31 associated with the address A1. Since the ECC circuit 20 is not invalidated, the decision circuit 40 needs not to hold the invalidation information with respect to the address A1.

It is then considered that a case where the data is read from the blocks 11a to 11d specified by the same address A1. The decision circuit 40 detects that the invalidation information regarding the address A1 does not exist by referring to the address signal ADD. In this case, since it is not necessary to invalidate the ECC circuit 20, the decision circuit 40 generates the enable signal ENB. The ECC circuit 20 is normally operated in response to this enable signal ENB. Also, a switch 50 transmits the read data DR read from the address A1 to the ECC decoding circuit 22 in response to the enable signal ENB. The ECC decoding circuit 22 receives the read data DR and the ECC read from the block 31 of the ECC cell array 30. The ECC decoding circuit 22 performs error detection/correction processing to the read data DR using the received ECC. The read data DR is outputted to the outside as output data Dout after the error detection/correction processing.

3. Part Writing/Reading

Figure 2:
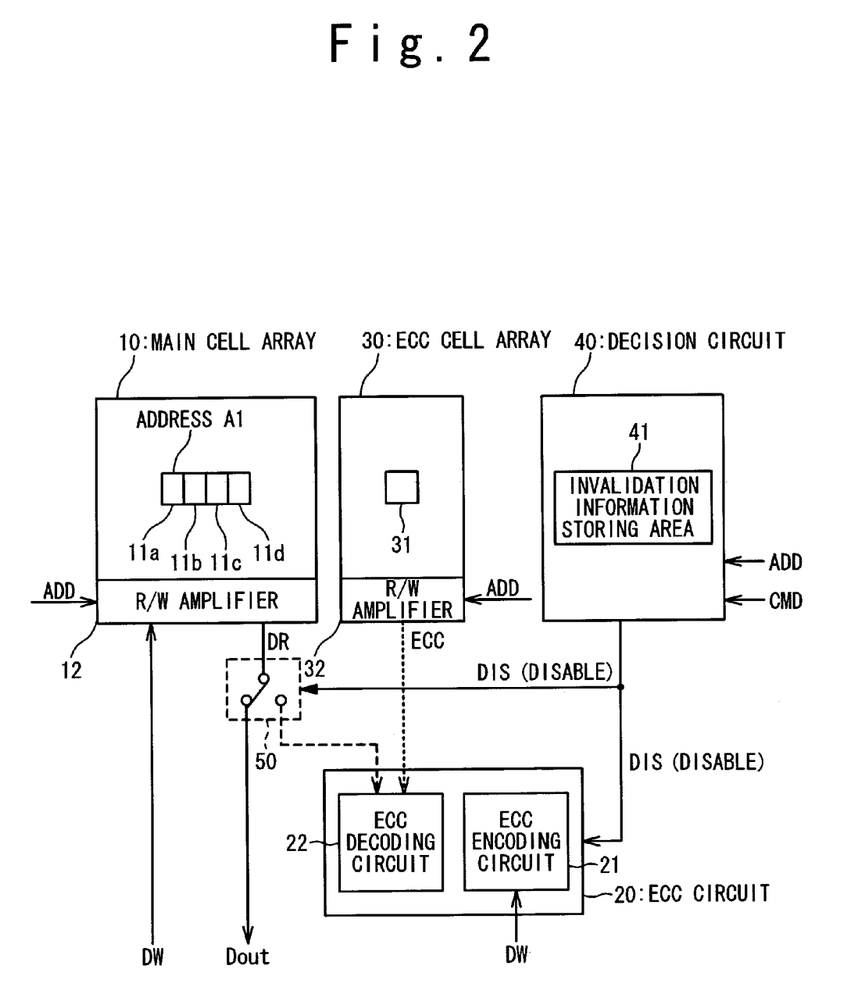
FIG. 2 is a block diagram showing the configuration of a semiconductor storage device when an invalidation signal DIS is generated in the embodiment of the present invention.

Next, referring to FIG. 2, the part writing operation and the following reading operation will be described. As the example, it is considered that a case where the write data DW of 1 byte is byte-written in the block 11a specified by the address A1. In this case, the data width of the write data DW does not satisfy a predetermined number of bits (32 bits). Therefore, the ECC circuit 20 cannot create the ECC as it is. Herein, although it is considered that one ECC is also calculated by filling some sort of data so as to satisfy a predetermined number of bits, the ECC circuit 20 is invalidated and calculation processing of the ECC is skipped according to the present embodiment. Thus, the decision circuit 40 is configured to invalidate the ECC circuit 20 when a data width of the write data DW is less than a predetermined data width, wherein the predetermined data width is a data width necessary for the ECC circuit 20 to calculate the error correction code.

The decision circuit 40 can detect that the part writing is performed by the command signal CMD which shows the "byte write". In this case, the decision circuit 40 outputs an "invalidation signal DIS" for invalidating the ECC circuit 20 to the ECC circuit 20. The ECC circuit 20 is invalidated by the invalidation signal DIS, and the ECC function is stopped. That is, the ECC encoding circuit 21 skips the calculation processing of the ECC, and does not newly calculate the ECC associated with the address A1. Therefore, the ECC stored in the block 31 corresponding to the address A1 is not newly updated, and only the write data DW is byte-written in the block 11a. Since the ECC corresponding to the address A1 is not updated, the ECC has no meaning any more. Since the ECC cannot be used in the reading operation, it is necessary to hold information which shows that the ECC is invalid. Therefore, the decision circuit 40 stores the invalidation information associated with the address A1 in the invalidation information storing area 41.

It is then considered that a case where the data is read from the blocks 11a to 11d specified by the same address A1. The decision circuit 40 refers to the address signal ADD to detect that the invalidation information regarding the address A1 is stored in the invalidation information storing area 41. Thereby, the decision circuit 40 recognizes that the ECC associated with the address A1 has been already invalid. Since the error detection/correction processing due to the ECC circuit 20 cannot be performed, the decision circuit 40 uses the invalidation information to generate the invalidation signal DIS.

The ECC circuit 20 is invalidated by this invalidation signal DIS. That is, the ECC circuit 20 skips the error detection/correction processing for the read data DR in response to the invalidation signal DIS. At this time, the switch 50 outputs the read data DR read from the address A1 to the outside as the output data Dout as it is in response to the invalidation signal DIS. That is, the read data DR is outputted to the outside as it is without passing through the ECC circuit 20. This switch 50 may be considered to be a part of the ECC circuit 20. The invalid ECC may be read from the block 31 of the ECC cell array 30, and may not be read.

4. Decision Circuit 40

Examples of the decision circuit 40 for realizing the processing described above include the following.

Figure 3:
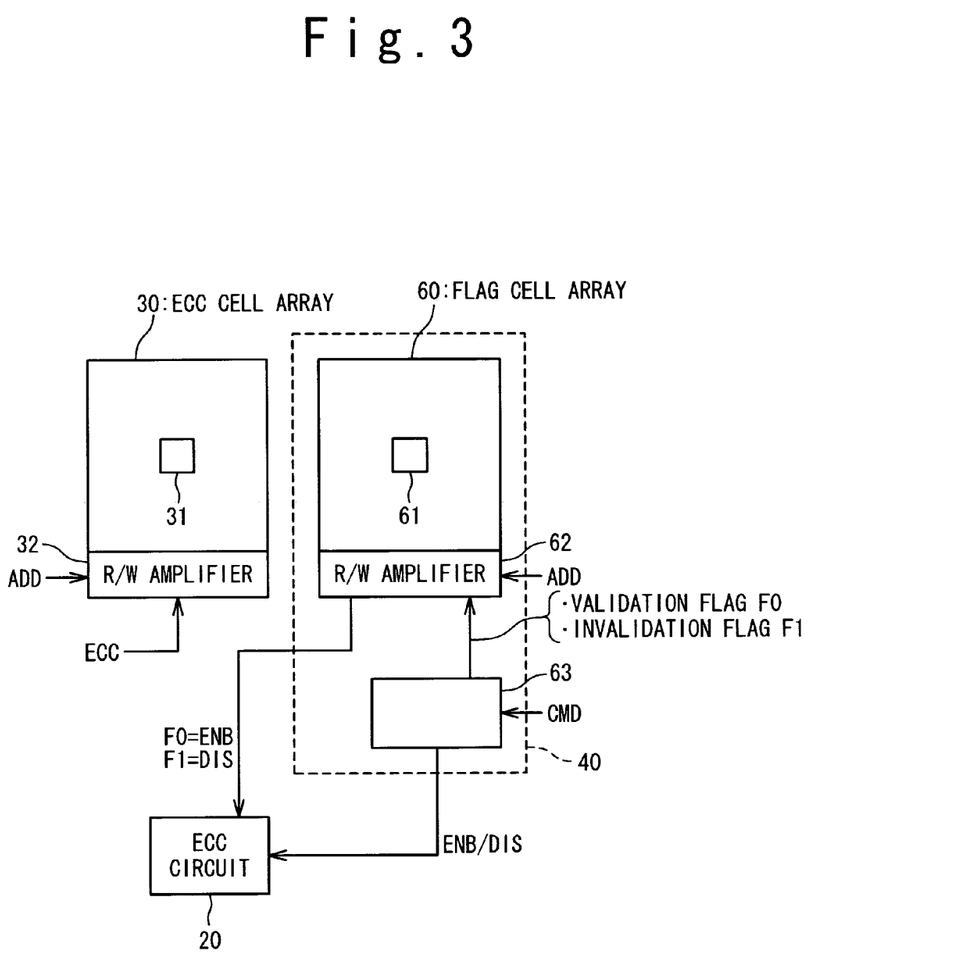
FIG. 3 is a block diagram showing an example of a decision circuit according to the present embodiment.

The decision circuit 40 shown in FIG. 3 includes a flag cell array 60 and a controller 63. The flag cell array 60 is a storage area for storing a flag which shows whether the ECC is valid or invalid, and is a part of same memory cell array as the main cell array 10 or the ECC cell array 30. The flag contains a validation flag F0 which shows that the ECC is valid and an invalidation flag F1 which shows that the ECC is invalid. An R/W amplifier 62 writes and reads the flag to the flag cell array 60 based on the address signal ADD.

The controller 63 determines whether or not the part writing is performed based on the command signal CMD. When the command signal CMD shows not the "part writing" but the "ordinary writing", the controller 63 outputs the enable signal (validation signal) ENB to the ECC circuit 20. In this case, certain ECC is calculated by the ECC circuit 20, and the calculated ECC is written in the block 31 associated with the address shown by the address signal ADD. At the same time, the validation flag F0 which shows that the ECC is valid is recorded in a flag cell 61 associated with the address shown by the address signal ADD. For example, the value of the validation flag F0 is "0".

On the other hand, when the command signal CMD shows the "part writing" such as the byte write, the controller 63 outputs the invalidation signal DIS to the ECC circuit 20. In this case, the ECC is not calculated and the ECC is also not written. However, the invalidation flag F1 which shows that ECC is invalid is recorded in the flag cell 61 associated with the address shown by the address signal ADD. The value of the invalidation flag F1 is, for example, "1". This invalidation flag F1 corresponds to the above invalidation information, and the flag cell array 60 corresponds to the invalidation information storing area 41.

The R/W amplifier 62 reads the flag from the flag cell 61 associated with the address shown by the address signal ADD in reading the data. If the read flag is the validation flag F0, the ECC corresponding to the address is valid. Therefore, the validation flag F0 is transmitted to the ECC circuit 20 as the validation signal ENB as it is. On the other hand, if the read flag is the invalidation flag F1, the ECC corresponding to the address is invalid. Therefore, the invalidation flag F1 is transmitted to the ECC circuit 20 as the invalidation signal DIS as it is.

Figure 4:
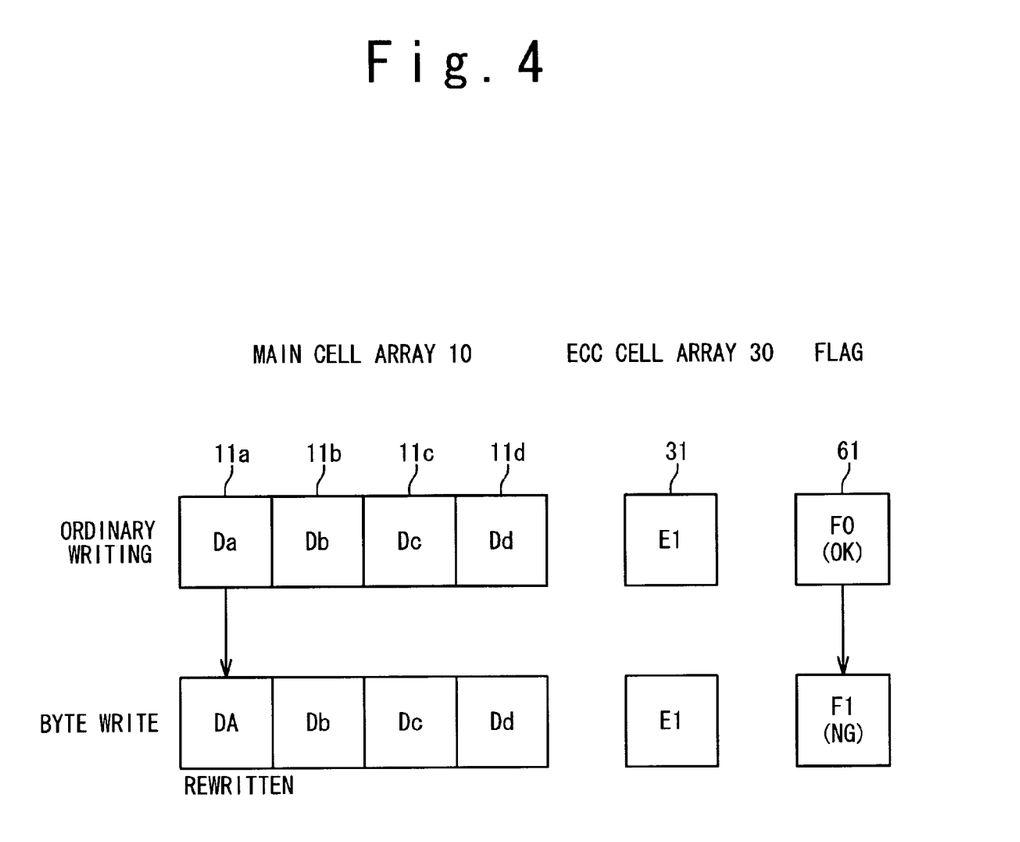
FIG. 4 is a schematic diagram showing an example of a part writing according to the present embodiment.

An example of rewriting the flag is shown in FIG. 4. First, write data Da to Dd (32 bits) are written in the blocks 11*a* to 11*d* specified by the address A1 in the main cell array 10 by the ordinary writing. The ECC (E1: 6 bit) is written in the block 31 associated with the address A1 in the ECC cell array 30. The validation flag F0 (1 bit) is written in the flag cell 61 associated with the address A1 in the flag cell array 60.

Next, it is assumed that the byte write is performed to the block 11*a*. At this time, the data Da of the block 11*a* is rewritten with new data DA (8 bits), and the flag of the flag cell 61 is rewritten to the invalidation flag F1 from the validation flag F0. Since the ECC is not calculated, the ECC remain the E1. Herein, the ECC to the data DA, Db, Dc, Dd stored in the blocks 11*a* to 11*d* must be no longer a different value from the E1. That is, the ECC recorded in the block 31 associated with the address A1 is invalid. The invalidation flag F1 recorded in the flag cell 61 shows this matter.

The validation flag F0 or the invalidation flag F1 described above can be also considered to be a bit newly added to the ECC. That is, in the example shown in FIGS. 3 and 4, it can be said that the "ECC with the flag" is used instead of the "ordinary ECC". When the part writing is performed, it can be said that only the flag is updated.

Figure 5:
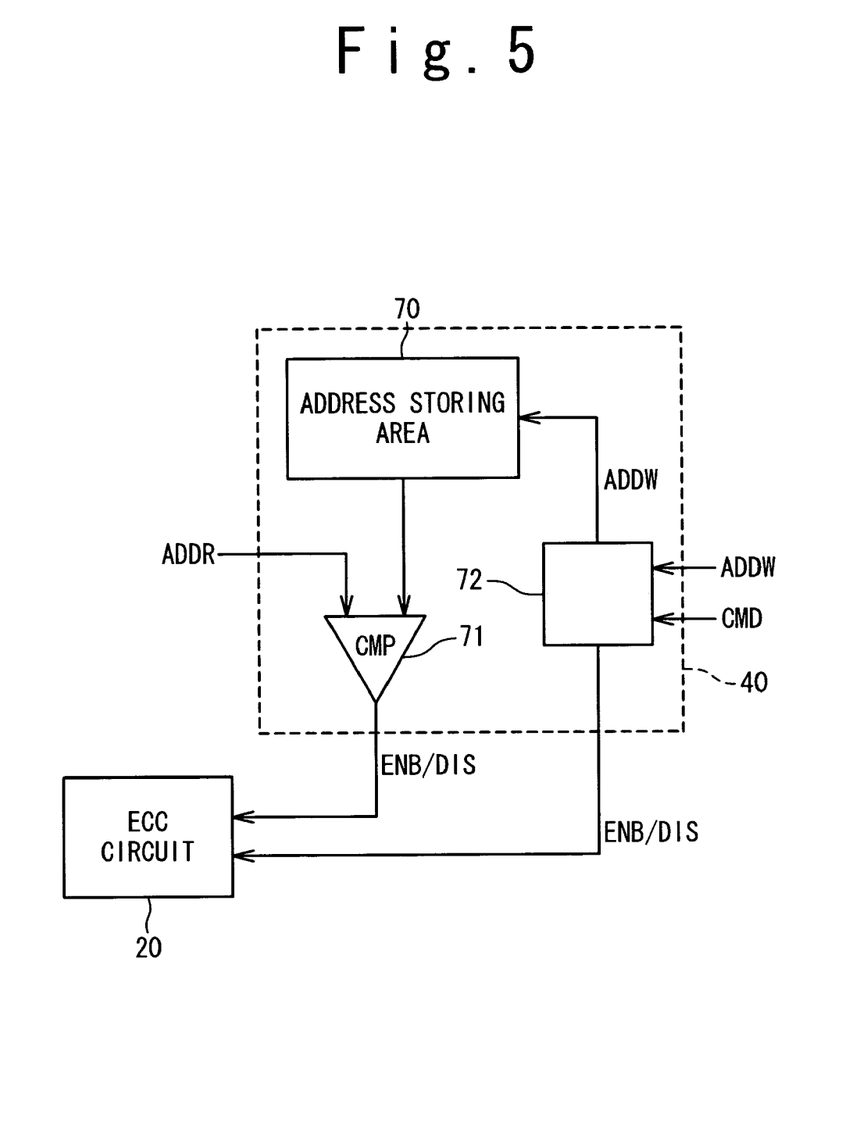
FIG. 5 is a block diagram showing another example of a decision circuit according to the present embodiment.

Also, another example of the decision circuit 40 is shown in FIG. 5. The decision circuit 40 shown in FIG. 5 includes an address storing area 70, a comparator 71 and a controller 72. An address to which the part writing is performed is stored in the address storing area 70. The controller 72 determines whether or not the part writing is performed based on the command signal CMD. When the command signal CMD is not the "part writing" but the "ordinary writing", the controller 72 outputs the enable signal (validation signal) ENB to the ECC circuit 20. Nothing is stored in the address storing area 70.

On the other hand, when the command signal CMD shows the "part writing" such as the byte write, the controller 72 outputs the invalidation signal DIS to the ECC circuit 20. Thereby, the ECC circuit 20 is invalidated. The controller 72 stores address information shown by a write address signal ADDW in the address storing area 70. The address information shows the address itself in which the ECC is invalid, and corresponds to the above invalidation information. Also, the address storing area 70 corresponds to the above invalidation information storing area 41.

A read address signal ADDR which shows an object to be read is inputted into the comparator 71 in reading the data. The comparator 71 compares a read address shown by the read address signal with an invalidation address stored in the address storing area 70. When the read address does not coincide with the invalidation address, the ECC to the read address is valid. Therefore, the output (for example, "0") of the comparator 71 is outputted as the validation signal ENB as it is. On the other hand, when the read address coincides with the invalidation address, the ECC to the read address is invalid. Therefore, the output (for example, "1") of the comparator 71 is outputted as the invalidation signal DIS as it is.

The example shown in FIG. 5 suppresses the consumption of a memory space. However, an address comparison operation due to the comparator 71 is required in reading the data. However, it needs only to be determined whether or not the invalidation signal DIS should be generated until the read data DR is inputted into the ECC circuit 20. Therefore, the address comparison due to the comparator 71 needs only to be carried out simultaneously with the data reading operation due to the R/W amplifier 12 (see FIG. 1). Delay of the processing time due to the address comparison operation is not generated.

5. Effect

As described above, according to the present invention, when the write data DW does not satisfy a predetermined number of bits, the ECC calculation processing is omitted. By way of comparison, it is assumed that the ECC is also created in the part writing. For example, as shown below, it is considered that one ECC is calculated by filling the data so as to satisfy the predetermined number of bits. Referring to FIG. 4, when the byte write is performed, the data Da to Dd are once read from the blocks 11*a* to 11*d* (dummy read processing), and only the data Da is replaced with the write data DA of 1 byte. One ECC is calculated for data "DA, Db, Dc, Dd" of 32 bits. While the data "DA, Db, Dc, Dd" of 32 bits are then written in the blocks 11a to 11d, the calculated new ECC is written in the block 31. Thus, the valid ECC can be created also in the byte write by the dummy read processing.

Figure 6:
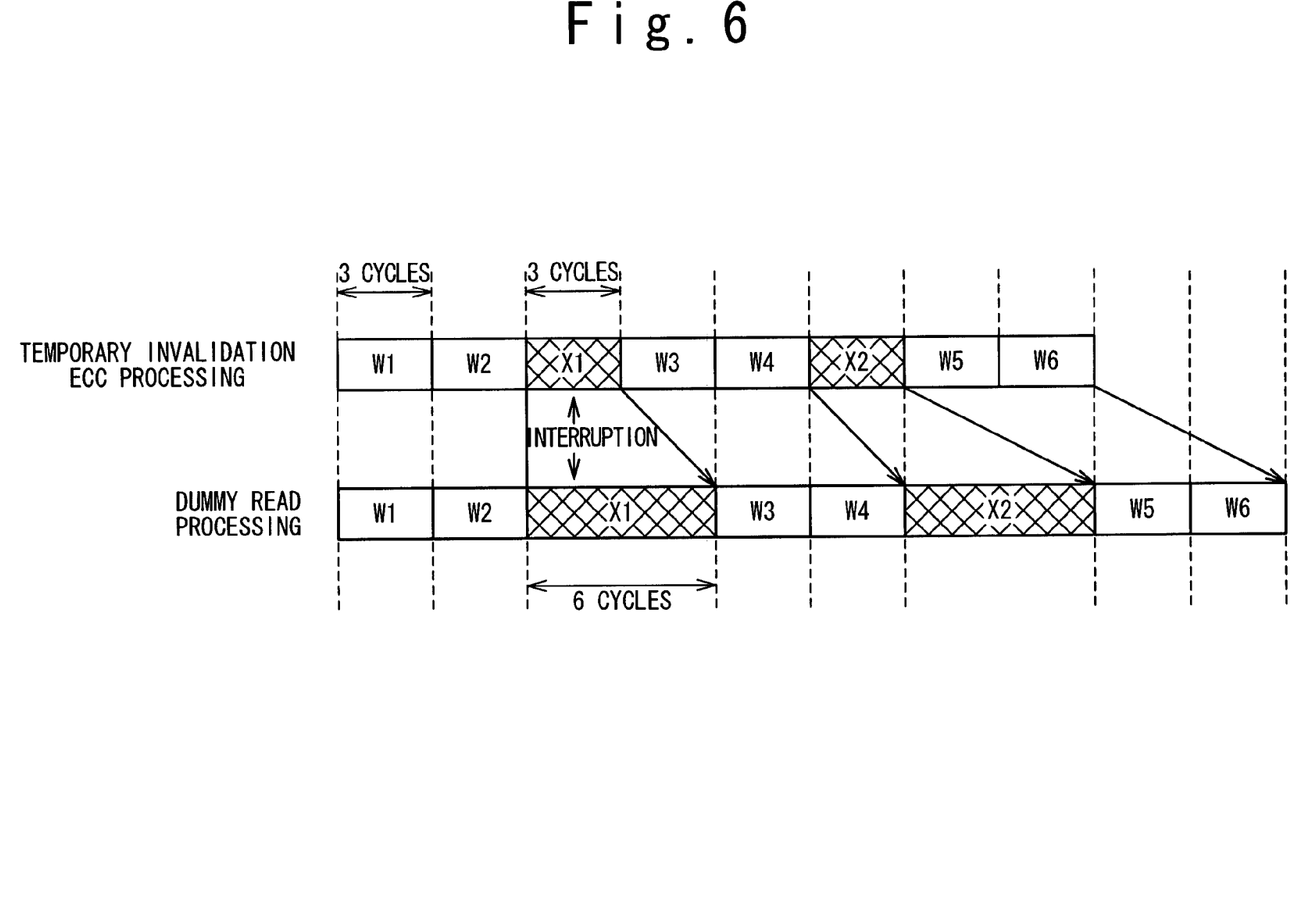
FIG. 6 is a timing chart for explaining an effect due to the present invention.

The comparison of the processing (ECC temporary invalidation) according to the present invention and the dummy read processing is shown in FIG. 6. It is assumed that 3 cycles are required for the ordinary writing in any processing. The byte write different from the ordinary writing is treated as "interruption" in the writing control. When the dummy read processing is performed in the byte write, the writing time is increased for the dummy read processing. For example, 6 cycles are required for the byte write. On the other hand, since the ECC processing is not performed according to the present invention, the same 3 cycles as that of the ordinary writing are sufficient. Therefore, the memory operation becomes high speed as compared with the case where the dummy read processing is performed. That is, the performance is improved according to the present invention. Also, it is not necessary to change the writing cycle in the normal operation and the byte write. That is, the writing cycle can be uniformly set without depending on the data width of the write data DW. Since a particular cycle control for corresponding to the interruption is not required, the cycle control is simplified.

As described above, according to the semiconductor storage device according to the present invention, the performance is improved, and the controllability of the cycle is improved.

The argument on the influence of the omission of the ECC processing on the memory reliability is as follows. Generally, large data such as image data and voice data are processed by the ordinary writing (in the above example, processed per 32 bits). On the other hand, the data processed by the byte write is often the variable or the like used by the application software. Therefore, it is considered that the area to which the byte write is performed is sufficiently smaller than the area to which the ordinary writing is performed. It is said that a degradation cell having deteriorated reliability is, for example, several bits of 256 MB. Therefore, the probability that the degradation cell is contained in the area to which the byte write is performed is considered to be very small. Therefore, based on a viewpoint of probability theory, it is considered that even if the ECC processing is omitted in the byte write, the memory reliability is not substantively reduced.

Also, although the area to which the byte write is performed is small, the variables or the like used by the application software are important on the system, and are frequently rewritten. This means that the interruption due to the byte write occurs frequently. The effect due to the present invention, that is, the improvements of the performance and cycle controllability become remarkable because the interruption occurs frequently (see FIG. 6). It can be said that the merit of omitting the ECC processing is large when the byte write is frequently carried out although the area to which the byte write is performed is small.

The semiconductor storage device according to the present invention can handle the part writing. Also, an operation speed of the semiconductor storage device is increased as a whole.

It is apparent that the present invention is not limited to the above embodiment that may be modified and changed without departing from the scope and spirit of the invention.

What is claimed is:

1. A semiconductor memory device, comprising:
a memory cell array;
an ECC (error correction code) circuit configured to calculate an error correction code for write data to be written in said memory cell array; and
a decision circuit configured to both generate invalidation information to invalidate said ECC circuit when a data width of said write data is less than a predetermined data width and to generate validation information to validate said ECC circuit when said data width of said write data is said predetermined data width,
wherein said predetermined data width is a data width necessary for said ECC circuit to calculate said error correction code.

2. The semiconductor memory device according to claim 1, wherein said ECC circuit skips said calculation of said error correction code when being invalidated.

3. The semiconductor memory device according to claim 1, wherein said write data of which data width is less than said predetermined data width is written in a first address of said memory cell array, and
said decision circuit holds an invalidation information related to said first address.

4. The semiconductor memory device according to claim 3, wherein said decision circuit outputs an invalidation signal which invalidates said ECC circuit based on said invalidation information, when said first address is accessed in a read processing.

5. The semiconductor memory device according to claim 4, wherein said ECC circuit skips error detection and correction processing for read data read from said first address in response to said invalidation signal.

6. The semiconductor memory device according to claim 4, wherein read data read from said first address is outputted to an outside without passing through said ECC circuit.

7. The semiconductor memory device according to claim 4, wherein said decision circuit includes:
a flag cell array configured to store a flag indicating that said error correction code is one of valid and invalid,
wherein said decision circuit stores an invalidation flag as said invalidation information in said flag cell array when said data width of said write data is less than said predetermined data width, and
wherein said decision circuit reads said invalidation flag from said flag cell array and outputs said read invalidation flag as said invalidation information, when said first address is accessed in a read processing.

8. The semiconductor memory device according to claim 4, wherein said decision circuit includes:
an address storing portion configured to store address information indicating said first address as said invalidation information, and
a comparator configured to compare said first address indicated by said address information with a read targeted address,
wherein said comparator generates said invalidation signal when said read targeted address and said first address.

9. The semiconductor memory device according to claim 8, further comprising:
a read circuit configured to read data stored in said read targeted address from said memory cell array,
wherein said comparator executes said compression in parallel with an operation of said read circuit.

10. The semiconductor memory device according to claim 1, wherein a cycle necessary to write said write data is constant without depending on a data width of said write data.

11. A method of operating a semiconductor memory device, comprising:
(a) an ECC (error correction code) circuit calculating an error correction code for write data to be written in a memory cell array; and (b) a decision circuit generating both invalidation information for invalidating said ECC circuit when a data width of said write data is less than a predetermined data width and validation information for validating said ECC circuit when a data width of said write data is said predetermined data width, wherein said predetermined data width is a data width necessary for said ECC circuit to calculate said error correction code.

12. The method of operating a semiconductor memory device according to claim 11, further comprising:

(c) said ECC circuit skipping said calculation of said error correction code when being invalidated.

13. The method of operating a semiconductor memory device according to claim 11, wherein said write data of which data width is less than said predetermined data width is written in a first address of said memory cell array, and said step (b) includes:

(b1) said decision circuit holding an invalidation information related to said first address.

14. The method of operating a semiconductor memory device according to claim 13, wherein said step (b) further includes:

(b2) said decision circuit outputting an invalidation signal which invalidates said ECC circuit based on said invalidation information, when said first address is accessed in a read processing.

15. The method of operating a semiconductor memory device according to claim 14, further comprising:

(d) said ECC circuit skipping error detection and correction processing for read data read from said first address in response to said invalidation signal.

* * * * *